(12) United States Patent
Cai

(10) Patent No.: US 10,468,475 B2
(45) Date of Patent: Nov. 5, 2019

(54) DISPLAY PANEL AND DISPLAY DEVICE

(71) Applicant: SHANGHAI TIANMA MICRO-ELECTRONICS CO., LTD., Shanghai (CN)

(72) Inventor: Xiaobo Cai, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 48 days.

(21) Appl. No.: 15/787,716

(22) Filed: Oct. 19, 2017

(65) Prior Publication Data

US 2018/0040680 A1 Feb. 8, 2018

(30) Foreign Application Priority Data

May 12, 2017 (CN) .......................... 2017 1 0333249

(51) Int. Cl.
| | |
|---|---|
| *H01L 27/32* | (2006.01) |
| *H01L 51/00* | (2006.01) |
| *G09G 3/20* | (2006.01) |
| G09G 3/3233 | (2016.01) |
| G09G 3/3266 | (2016.01) |

(52) U.S. Cl.
CPC ........... *H01L 27/3262* (2013.01); *G09G 3/20* (2013.01); *H01L 27/3248* (2013.01); *H01L 27/3276* (2013.01); *H01L 51/0097* (2013.01); *G09G 3/3233* (2013.01); *G09G 3/3266* (2013.01); *G09G 2300/0439* (2013.01);
(Continued)

(58) Field of Classification Search
CPC ............. H01L 51/0097; H01L 27/3276; H01L 27/3262; H01L 27/3248; H01L 2251/5338; G09G 3/20; G09G 3/3233; G09G 2300/0439; G09G 2320/04; G09G 2320/0233; G09G 3/3266; G09G 2380/02
See application file for complete search history.

(56) References Cited

U.S. PATENT DOCUMENTS

| | | | |
|---|---|---|---|
| 8,159,130 B2 | 4/2012 | Shim et al. | |
| 2004/0032385 A1 | 2/2004 | Park | |

(Continued)

FOREIGN PATENT DOCUMENTS

| | | | |
|---|---|---|---|
| CN | 101573741 A | 11/2009 | |
| CN | 103713436 A | 4/2014 | |

(Continued)

*Primary Examiner* — Ahmed N Sefer
(74) *Attorney, Agent, or Firm* — Kilpatrick Townsend & Stockton, LLP

(57) ABSTRACT

The invention discloses a display panel and a display device. The display panel including a fold area, and at least one non-fold area proximate to the fold area, the display panel includes: an underlying substrate, a plurality of light-emitting elements, and a plurality of pixel circuit units arranged on the underlying substrate, which are arranged in the non-fold area; and the non-fold area includes at least one first area and second area; and there are a plurality of the pixel circuit units arrayed respectively in the first area and the second area, the first area is adjacent to the fold area, the second area is located on the side of the first area away from the fold area, and the distribution density of the pixel circuit units in the first area is higher than or equal to the distribution density of the pixel circuit units in the second area.

18 Claims, 14 Drawing Sheets

(52) U.S. Cl.
 CPC . *G09G 2320/0233* (2013.01); *G09G 2320/04* (2013.01); *G09G 2380/02* (2013.01); *H01L 2251/5338* (2013.01)

(56) References Cited

U.S. PATENT DOCUMENTS

| | | |
|---|---|---|
| 2004/0227703 A1 | 11/2004 | Lamvik et al. |
| 2008/0284929 A1 | 11/2008 | Kimura |
| 2014/0361262 A1* | 12/2014 | Kim .................... H01L 27/3218 257/40 |
| 2016/0240602 A1 | 8/2016 | Ki et al. |
| 2016/0240801 A1* | 8/2016 | Chang ................ H01L 51/0097 |
| 2017/0032737 A1* | 2/2017 | Lee ...................... G09G 3/3225 |
| 2017/0153668 A1* | 6/2017 | Jang ...................... G06F 1/1641 |
| 2017/0262022 A1* | 9/2017 | Choi ..................... G02B 5/3025 |
| 2017/0338294 A1* | 11/2017 | Choi .................... H01L 27/3276 |
| 2018/0033843 A1* | 2/2018 | Liu .................... G02F 1/133305 |
| 2018/0322848 A1* | 11/2018 | Wu .......................... G09G 5/14 |
| 2019/0013486 A1* | 1/2019 | Li ....................... H01L 51/0097 |

FOREIGN PATENT DOCUMENTS

| | | |
|---|---|---|
| CN | 104157246 A | 11/2014 |
| CN | 105144270 A | 12/2015 |
| CN | 105895660 A | 8/2016 |
| CN | 104241295 A | 10/2017 |

\* cited by examiner

DISPLAY PANEL AND DISPLAY DEVICE

CROSS-REFERENCES TO RELATED APPLICATIONS

This application claims priority to Chinese patent application No. 201710333249.8 filed on May 12, 2017 and titled "DISPLAY PANEL AND DISPLAY DEVICE", which is incorporated herein by reference in its entirety.

FIELD

The present invention relates to the field of display technologies, and particularly to a display panel and a display device.

BACKGROUND

A foldable display device convenient to carry is an important development trend of future display devices.

At present, the foldable display device is generally manufactured by putting together a plurality of small display screens into an integral display panel so that they are put together in foldable areas. However a plurality of flexible display screens are put together into a foldable display panel applicable to a large display screen, then this solution may not come with a satisfactory display effect on a small display device, e.g., a mobile phone, a tablet computer, etc., around the fold areas, thus degrading the display effect throughout the display panel.

Furthermore when the display panel is a flexible display panel, then there is a large bending radius, then there may be a bending effect even if pixel circuits in the display panel, and peripheral shift registers are not designed with robustness against bending, but when there is a small bending radius, then semiconductor elements in the pixel circuits and the peripheral shift registers may be bent and thus damaged, thus degrading the display effect in the fold areas.

Accordingly the display effect on the display panel having the fold areas in the prior art may be degraded due to the structural characteristic of the pixel circuits.

SUMMARY

Embodiments of the invention provide a display panel and a display device so as to improve the robustness against bending of the display panel without degrading the display effect on the display panel.

In a first aspect, an embodiment of the invention provides a display panel including at least one fold area, and at least one non-fold area proximate to the fold area, the display panel including: an underlying substrate, a plurality of light-emitting elements, and a plurality of pixel circuit units arranged on the underlying substrate, the plurality of pixel circuit units being arranged in the non-fold area; and the non-fold area includes at least one first area and at least one second area; and there are a plurality of the pixel circuit units arranged in array respectively in the first area and the second area, the first area is adjacent to the fold area, the second area is located on the side of the first area away from the fold area, and a distribution density of the pixel circuit units in the first area is higher than or equal to a distribution density of the pixel circuit units in the second area.

In a second aspect, an embodiment of the invention provides a display device including the display panel according to the embodiment of the invention.

Advantageous effects of the embodiments of the invention are as follows.

The display panel according the embodiment of the invention includes at least one fold area, and at least one non-fold area proximate to the fold area; and the display panel includes: an underlying substrate, a plurality of light-emitting elements, and a plurality of pixel circuit units arranged on the underlying substrate, which are arranged in the non-fold area; where the non-fold area includes at least one first area and second area; and there are a plurality of the pixel circuit units arranged in an array respectively in the first area and the second area, the first area is adjacent to the fold area, the second area is located on the side of the first area away from the fold area, and the distribution density of the pixel circuit units in the first area is higher than or equal to the distribution density of the pixel circuit units in the second area. Accordingly in the display panel according to the embodiment of the invention, the pixel circuit units are arranged in the non-fold area, and there are no pixel circuit units arranged in the fold area, so that the pixel circuit units can be avoided from being damaged while the fold area is being folded or bent; and furthermore the pixel circuit units corresponding to the fold area are arranged in the first area, and the distribution density of the pixel circuit units in the first area is higher than or equal to the distribution density of the pixel circuit units in the second area, so that the light-emitting elements corresponding to the fold area are driven by the pixel circuit units in the first area to thereby display normally so as to improve the robustness against bending of the display panel without degrading the display effect on the display panel.

DETAILED DESCRIPTION

Figure 1:
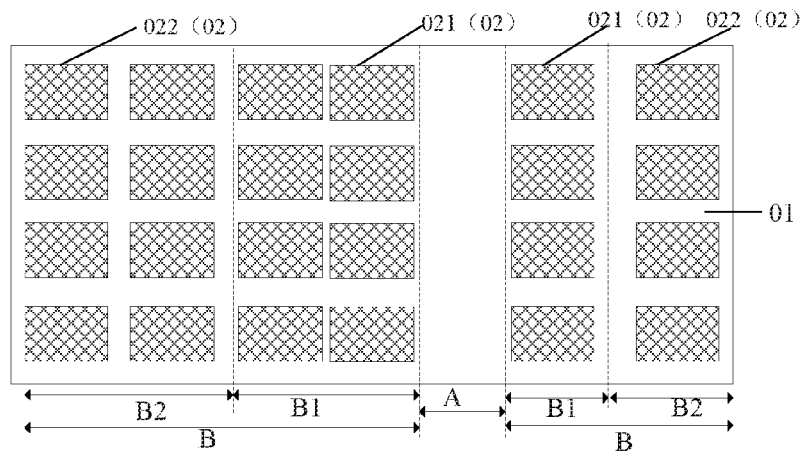
FIG. 1 is a schematic structural diagram of a display panel according to an embodiment of the invention.

In order to make the objects, features, and advantages above of the invention more apparent and readily understood, the invention will be described below in further details with reference to the drawings and the embodiments thereof. However the exemplary embodiments can be implemented in a number of forms, but shall not be construed as being limited to the embodiments described here; and on the contrary, these embodiments are provided to make the disclosure of the invention more full and complete, and to completely convey the idea of the embodiments to those skilled in the art. Like reference numerals in the drawings denote identical or like structures, so a repeated description thereof will be omitted. All the terms as described in the invention to represent positions and directions will be described by way of an example with reference to the drawings, but can also be varied as needed without departing from the scope of the invention as claimed. The drawings of the invention are merely intended to illustrate relative positional relationships, and thicknesses of some components may be exaggerated in the drawings for the sake of convenient understanding, but the thicknesses in the ilk drawings may not suggest any proportional relationship between the real thicknesses.

It shall be noted that particular details will be set forth in the following description to facilitate full understanding of the invention. However the invention can be embodied in a number of other embodiments than those described here, and those skilled in the art can generalize them without departing from the spirit of the invention. Accordingly the invention will not be limited to the particular embodiments to be disclosed below. For example, some words may be used in the description and the claims to refer to components. Those skilled in the art shall appreciate that hardware manufacturers may denominate the same component using different names. In the description and the claims, the components will not be distinguished using their different names, but will be distinguished using their different functions. For example, "include" or "comprise" or a variant thereof as referred to throughout the description and the claims is an open term, and thus shall be construed as "include but will not be limited to". Preferred embodiments of the invention will be described below merely for the purpose of setting forth the general principle of the invention, but not for limiting the scope of the invention thereto. The scope of the invention as claimed shall be as defined in the appended claims. It shall be appreciated that if one element, e.g., a layer, a film, an area, or a substrate, is referred to as being "on" another element, then the element may be directly on the other element, or there may be one or more elements arranged between them.

Embodiments of the invention provide a display panel and a display device so as to improve the robustness against bending of the display panel without degrading the display effect on the display panel.

Referring to FIG. 1, a display panel according to an embodiment of the invention includes at least fold area A, and at least one non-fold area B proximate to the fold area A; and the display panel includes: an underlying substrate 01, a plurality of light-emitting elements (not illustrated in FIG. 1, and to be described below in details), and a plurality of pixel circuit units 02 arranged on the underlying substrate 01, the plurality of pixel circuit units are arranged in the non-fold area B.

The non-fold area B includes at least one first area B1, and at least one second area B2; and there are a plurality of pixel circuit units 02 arranged in an array respectively in the first area B1 and the second area B2, the first area B1 is adjacent to the fold area A, the second area B2 is located on the side of the first area B1 away from the fold area A, and the pixel circuit units 02 are distributed in the first area B1 at a higher or the same density than the distribution density of the pixel circuit units 02 in the second area B2.

It shall be noted that there may be one or more fold areas in the display panel A according to the embodiment of the invention, and the fold area(s) may be arranged at any position(s) in a display area of the display panel, or may be arranged in a non-display area. Preferably the width of the fold area in the embodiment of the invention can range from 0 to 1 mm, but will not be limited thereto. The underlying substrate of the display panel according to the embodiment of the invention may be a flexible substrate, or may be flexible in the fold area, and rigid in the non-fold area, or may be more flexible in the fold area than in the non-fold area, although the embodiment of the invention will not be limited thereto. Furthermore the numbers and distribution occupancies of the first area and the second area may or may not be the same although the embodiment of the invention will not be limited thereto.

Figure 2A:
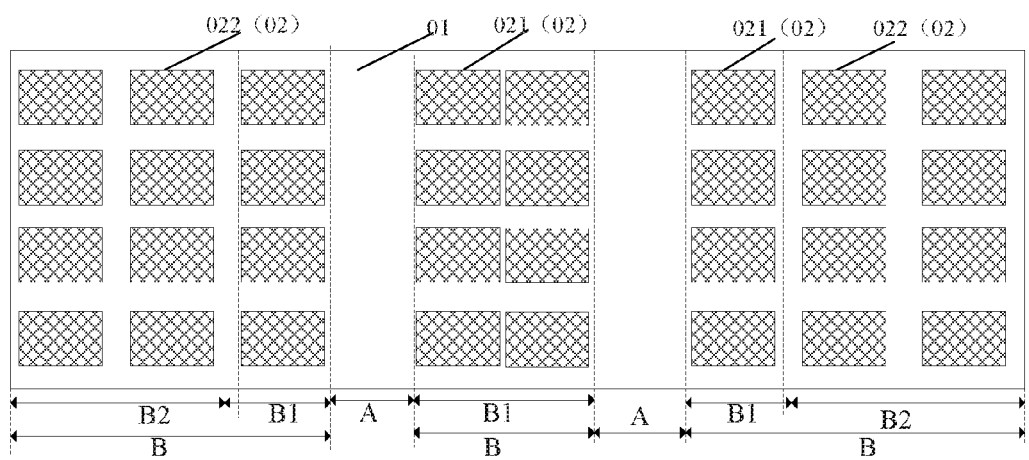
FIG. 2A is a schematic structural diagram of a second display panel according to an embodiment of the invention.

For example, referring to FIG. 2A, the display area includes two fold areas A and three non-fold areas B, where the fold areas B each include a first area B1 adjacent to the fold area A, and a second area B2 on the side of the first area B1 away from the fold area. There is a shorter distance between the two adjacent fold areas A, and pixel circuit units corresponding to the two fold areas are arranged in the first areas on two sides of the fold areas, so the non-fold area B between the two adjacent fold areas A includes only the first area B1.

Figure 2B:
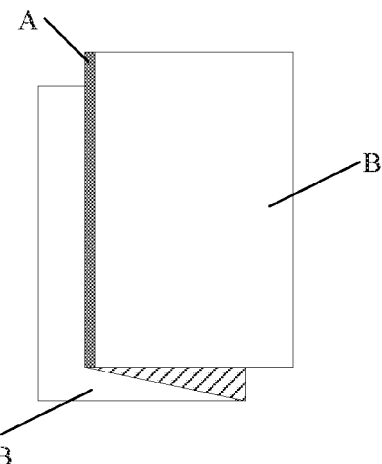
FIG. 2B is a schematic perspective view of the display panel according to the embodiment of the invention.

The folding directions of the two fold areas A may or may not be the same. When the folding directions of the two fold areas A are the same, then the display panel may be folded as illustrated in FIG. 2B.

It shall be noted that FIG. 1 illustrates the display panel including only one fold area, and FIG. 2A illustrates the display panel including only two fold areas, but the display panel may include more than two fold areas. The display panel may include a plurality of first areas, and the pixel circuit units may or may not be distributed at the same density in each of the first areas, although the embodiment of the invention will not be limited thereto. Since no pixel circuit units are arranged in the fold area(s) in the embodiment of the invention, the bending radius of the fold area may be set small at will although the embodiment of the invention will not be limited thereto. Furthermore the pixel circuit units in the embodiment of the invention are generally configured to drive light-emitting elements in the display panel to display, so the number of pixel circuit units in the embodiment of the invention is the same as the number of light-emitting elements.

As compared with the prior art, in the display panel according to the embodiment of the invention, all the pixel circuit units are arranged in the non-fold area and there are no pixel circuit units in the fold area, so that when the display panel is bent, then the pixel circuit units will not be affected by the bending radius of the fold area no matter how small the bending radius is, and the elements in the pixel circuit units will not be damaged while the display panel is being folded, thus improving the display effect on the display panel. Particularly the non-fold area is divided into the first area and the second area, the pixel circuit units are arranged respectively in the first area and the second area, and the distribution density of the pixel circuit units in the first area can be varied so that the pixel circuit units which originally needs to be arranged in the fold area and the non-fold area are distributed in the first area and the second area. Accordingly the pixel circuit units in the embodiment of the invention still can drive normally any light-emitting element in the display panel to display, to thereby improve the robustness against bending of the display panel without hindering the display panel from displaying normally.

In one embodiment, the distribution density of the pixel circuit units 021 in the first area B1 is higher than or equal to the distribution density of the pixel circuit units 022 in the second area B2 in a number of implementations. For example, in a first implementation, the distance between every two adjacent pixel circuit units is varied so that the pixel circuit units 021 are distributed in the first area more densely to thereby vary the distribution density of the pixel circuit units in the first area, thus making the distribution density of the pixel circuit units 021 in the first area higher than or equal to the distribution density of the pixel circuit units 022 in the second area; and in a second implementation, the occupancy area of each of the pixel circuit units 021 in the first area is reduced, and the distance between two adjacent pixel circuit units 021 in the first area is shortened, so that the distribution density of the pixel circuit units in the first area is higher than or equal to the distribution density of the pixel circuit units in the second area. Of course, there may be other implementations although a detailed description thereof will be omitted here.

The particular structure of the display panel will be described below in details in connection with particular implementation thereof.

Figure 3:
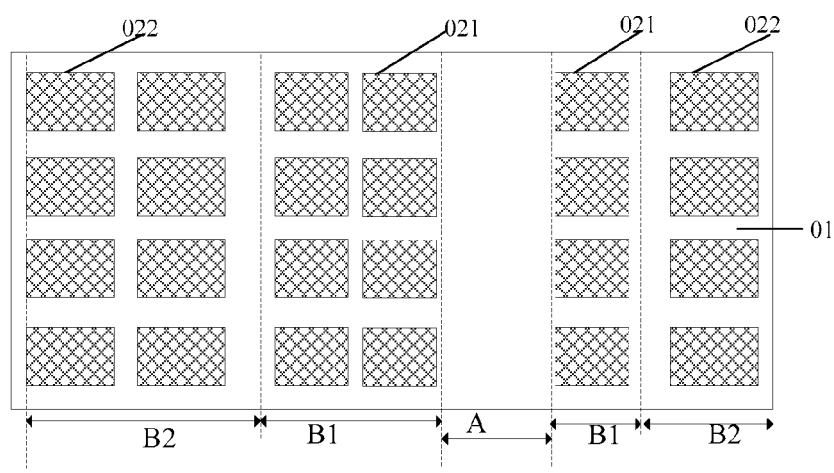
FIG. 3 is a schematic structural diagram of a third display panel according to an embodiment of the invention.

In one implementation, in the display panel above according to the embodiment of the invention, in order to further increase the distribution density of the pixel circuit units in the first area, the size of the pixel circuit units in the first area can be reduced, that is, the occupancy area of the pixel circuit units in the first area can be reduced, and referring to FIG. 3, the occupancy area of the pixel circuit units 021 in the first area B1 is smaller than the occupancy area of the pixel circuit units 022 in the second area B2. Particularly when there are a larger number of light-emitting elements corresponding to the fold area, then in order to arrange all the pixel circuit units corresponding to the fold area in the non-fold area, there may be a smaller size of the pixel circuit units in the first area of the non-fold area, so the first area will include both the pixel circuit units for driving the light-emitting elements corresponding to the first area, and the pixel circuit units for driving the light-emitting elements corresponding to the non-fold area; and when there are a small number of light-emitting elements corresponding to the fold area, for example, there are only one row or column of light-emitting elements in the fold area, then the pixel circuit units corresponding to the fold area may be arranged in the first area while the occupancy area of the pixel circuit units in the first area is equal to the occupancy area of the pixel circuit units in the second area. In some implementation, there is such a larger distance between two adjacent pixel circuit units that the pixel circuit units corresponding to the fold area can be arranged in the adjacent first area without reducing the occupancy areas of the pixel circuit units.

Figure 4:
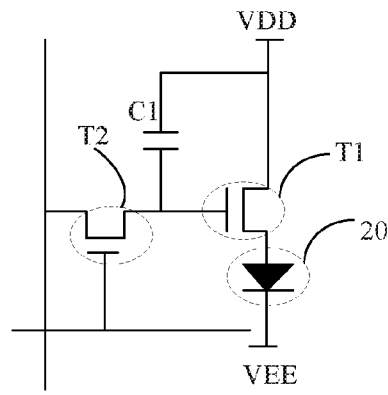
FIG. 4 is a schematic structural diagram of a pixel circuit unit according to an embodiment of the invention.

Particularly the pixel circuit units in the embodiment of the invention are configured to drive the light-emitting elements in the display panel to display an image, and in some implementation, as illustrated in FIG. 4 showing a pixel driver circuit of an OLED display panel as an example, the pixel circuit unit particularly includes a driver transistor T1 and a switch transistor T2, where the driver transistor T1 is configured to drive a light-emitting element 20 to emit light, and light-emission luminance is determined by voltage at a gate of the driver transistor T1, and the switch transistor T2 is configured to receive and transmit a signal, and to transmit a necessary voltage signal to the gate of the driver transistor T2 before the light-emitting element emits light; and VDD and VEE represent voltage sources configured to provide the light-emitting elements with a high-level signal and a low-level signal respectively, and current for the light-emitting element 20 to display satisfies the equation of:

$$I_{OLED} = K * \frac{W}{L}(V_{date} - V_{DD} + V_{th})^2, \quad (1)$$

Where $I_{OLED}$ represents current input to a light-emitting element, K represents a constant, $$\frac{W}{L}$$

represents the ratio of the width to the length of the driver transistor T1, $V_{date}$ represents voltage on a data line, $V_{DD}$ represents constant positive voltage, and $V_{th}$ represents threshold voltage of the driver transistor.

Figure 5:
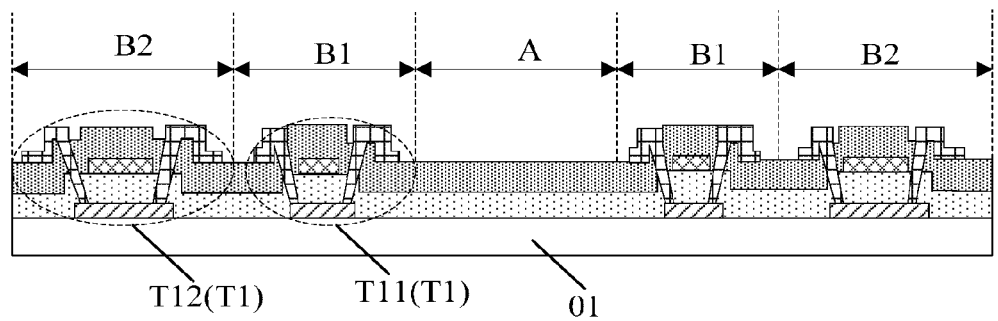
FIG. 5 is a schematic structural diagram of a fourth display panel according to an embodiment of the invention.

In one embodiment, when the occupancy area of each of the pixel circuit units in the first area is reduced so that the distribution density of the pixel circuit units in the first area is higher than or equal to the distribution density of the pixel circuit units in the second area, then the size of each of the driver transistors in the pixel circuit units in the first area may be further reduced so that the ratio of the width to the length of the driver transistor T1 may be varied, or a storage capacitance between the gate and the source and drain of the driver transistor may be varied, thus affecting the current $I_{OLED}$ input to the light-emitting element, which may result in a worse display effect on the display panel. Accordingly in order to avoid the current $I_{OLED}$ input to the light-emitting elements from becoming inconsistent with each other, in the display panel according to the embodiment of the invention, referring to FIG. 5, the each pixel circuit unit includes a driver transistor T1 and a switch transistor T2 (not illustrated in FIG. 5), the ratio of the length to the width of the driver transistor T11 in the first area B1 is the same as the ratio of the length to the width of the driver transistor T12 in the second area B2, and the storage capacitance between the source and drain and the gate of the driver transistor T11 in the first area is equal to the storage capacitance between the source and drain and the gate of the driver transistor T12 in the second area; and the occupancy area of the driver transistor T11 in the first area B1 is smaller than the occupancy area of the driver transistor T12 in the second area B2.

It shall be noted that the occupancy area of the driver transistor in the first area may alternatively be equal to the occupancy area of the driver transistor in the second area, that is, the occupancy area of the pixel circuit unit may be varied without varying the occupancy area of the driver transistor.

Accordingly in the embodiment of the invention, when the size of the driver transistor in the first area is reduced, then the size may be reduced as needed in a real application as long as the ratio of the length to width of each of the driver transistors in the first area and the second area is equal to each other, and the storage capacitance between the gate and the source and drain of each driver transistor in the first area and the second area is equal to each other.

Figure 6A:
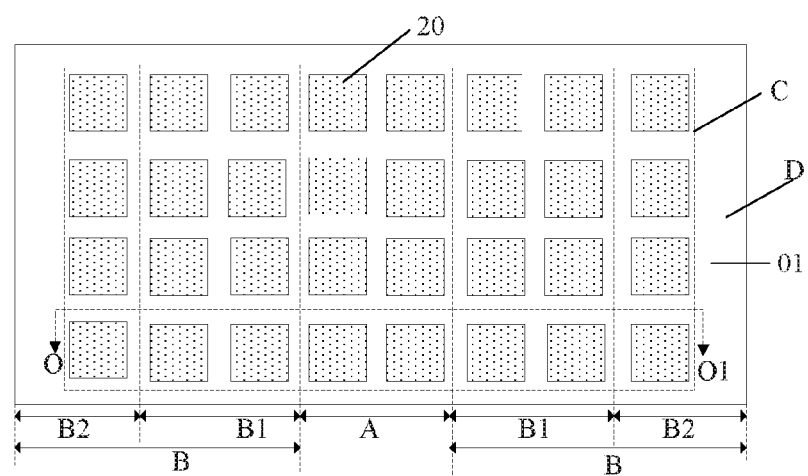
FIG. 6A is a schematic structural diagram of a fifth display panel according to an embodiment of the invention.
Figure 6B:
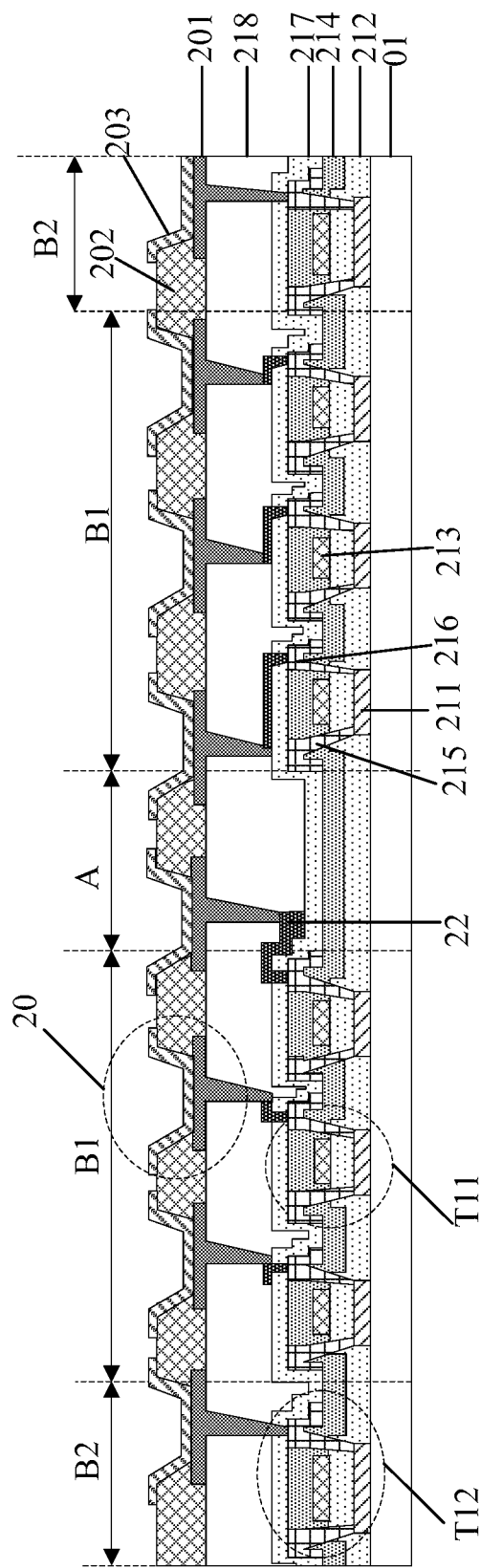
FIG. 6B is a schematic sectional view of FIG. 6A along O-O1.

In one implementation, referring to FIG. 6A and FIG. 6B, the display panel according to the embodiment of the invention includes a display area C, and an edge frame area D surrounding the display area C, and the display panel includes: an underlying substrate 01, and a plurality of light-emitting elements 20 arranged in an array on the underlying substrate 01 corresponding respectively to and electrically connected with pixel circuit units, where the light-emitting elements 20 are arranged uniformly in the display area C; and the pixel circuit units in the second area B2 substantially vertically correspond respectively to the light-emitting elements 20 and are electrically connected with the light-emitting elements 20, and the pixel circuit units in the first area B1 correspond respectively to the light-emitting elements 20 and are electrically connected with the light-emitting elements 20. Particularly the light-emitting elements 20 are arranged uniformly in the display area C, that is, the fold area A also includes the uniformly arranged light-emitting elements 20, the light-emitting elements 20 corresponding to the second area vertically correspond respectively to the driver transistors in the pixel circuit units in the second area, the pixel circuit units configured to drive the light-emitting elements 20 in the fold area A are arranged in the first area B1 adjacent to the fold area A, and the light-emitting elements 20 corresponding to the fold area and the first area are spaced vertically from the driver transistors and electrically connected with the driver transistors. As can be apparent, in the embodiment of the invention, the fold area includes the light-emitting elements, but not the pixel circuit units, so that no semiconductor material will be arranged in the fold area, thus avoiding the elements from being damaged while the fold area is being bent.

Particularly referring to FIG. 6B, a pixel circuit unit in the display panel includes a driver transistor electrically connected with the light-emitting element 20, and in an order away from the underlying substrate 01, the display panel includes: an active semiconductor layer 211 on the underlying substrate 01, where the active semiconductor layer includes source areas and drain areas formed by doping with N-type purity ions or P-type purity ions, and channel areas between the source areas and the drain areas in which no purities are doped with; a gate insulation layer 212, gates 213, and an interlayer insulation layer 214 formed on the active semiconductor layer 211, and patterns of sources 215 and drains 216, which are formed on the interlayer insulation layer 214, where the sources 215 and the drains 216 are electrically connected with the source areas and the drain areas in the active semiconductor layer respectively through contact holes in the gate insulation layer 212 and the interlayer insulation layer 214. The display panel further includes a passivation layer 217 and a planarization layer 218 arranged on the layers where the sources 215 and the drains 216 are located. The display panel further includes connection lines 22 electrically connected with the driver transistors T11 in the first area, where the respective drive transistors T1 in the first area B1 are electrically connected with the light-emitting elements 20 corresponding to the driver transistors through the connection lines 22, and the respective connection lines 22 are arranged at the same layer, and insulated from each other. In the embodiment of the invention, each driver transistor in the first area is electrically connected with a light-emitting element corresponding to the driver transistor through a connection line arranged at the same layer, so that the driver transistors an be arranged in the first area simply by adding one layer, thus making the fabrication process thereof simple, and the structure of the elements less weighted and simpler. It shall be noted that there may be one or more rows or columns of light-emitting elements in the fold area in the display area, where FIG. 6A illustrates the fold area including only two columns of light-emitting elements, and FIG. 6B is a schematic sectional view of FIG. 6A along O-O1. In the structure as illustrated in FIG. 6B, the two light-emitting elements 20 in the fold area A are electrically connected with their corresponding driver transistors through the connection lines arranged in the first areas on the left and right side thereof, and the connection lines are arranged at the same layer. In the embodiment of the invention, each driver transistor in the first area is electrically connected with the light-emitting element corresponding to the driver transistor through the connection line arranged at the same layer, so that the driver transistors an be arranged in the first area simply by adding one film layer, thus making the fabrication process thereof simple, and the structure of the elements less weighted and simpler.

Figure 7A:
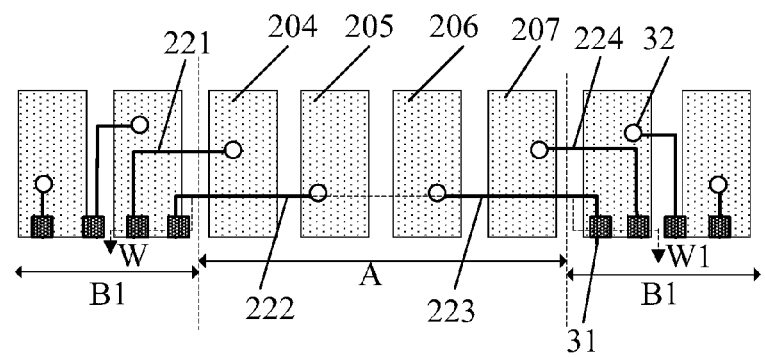
FIG. 7A is a schematic structural diagram of a sixth display panel according to an embodiment of the invention.
Figure 7B:
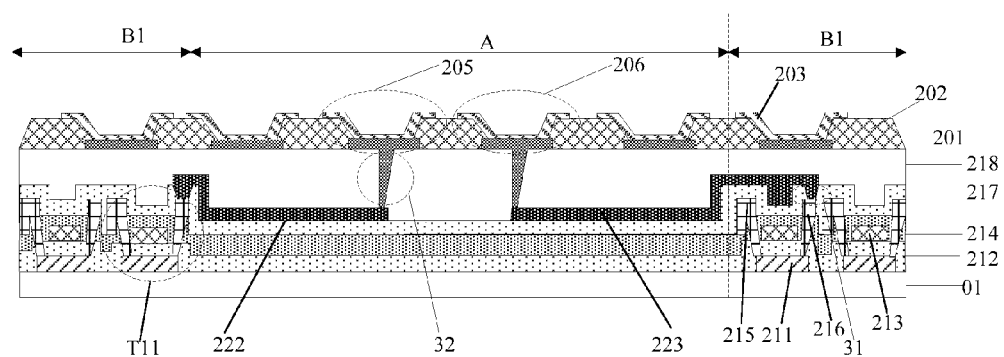
FIG. 7B is a schematic sectional view of FIG. 7A along W-W1.

In another example, referring to FIG. 7A, there are four columns of light-emitting elements, i.e., a light-emitting element 204, a light-emitting element 205, a light-emitting element 206, and a light-emitting element 207, in the fold area A, and the light-emitting elements in the same row in the fold area A are connected with connection lines in different rows, for example, the connection line 221 connected with the light-emitting element 204 is not in the same horizontal direction as the connection line 222 connected with the light-emitting element 205 and the connection line 223 connected with the light-emitting element 206 is not in the same horizontal direction as the connection line 224 connected with the light-emitting element 207. As illustrated in FIG. 7A, each light-emitting element is electrically connected through a connection line, a first via-hole 31, and a second via-hole 32, where the second via-hole 32 is a via-hole between the anode of the light-emitting element, and the connection line, and the first via-hole 31 is a via-hole between the connection line and the drain. Particularly FIG. 7B illustrates a schematic sectional view of FIG. 7A along W-W1, where the four light-emitting elements in the fold area. A are connected with their corresponding driver transistors respectively through the connection lines in the first area on the left and right side thereof, and all the connection lines are arranged at the same layer. Since the connection line 221 and the connection line 224 are not seen in the sectional view along W-W1, FIG. 7B only reflects the connection relationship between the light-emitting element 205 and the connection line 222, and the connection relationship between the light-emitting element 206 and the connection line 223. In the embodiment of the invention, each driver transistor in the first area is electrically connected with the light-emitting element corresponding to the driver transistor through the connection line arranged at the same layer, so that the driver transistors an be arranged in the first area simply by adding one film layer, thus making the fabrication process thereof simple, and the structure of the elements less weighted and simpler.

Alike in the display panel according to the embodiment of the invention, there may be a plurality of rows or columns of light-emitting elements in the fold area, which are electrically connected with the driver transistors corresponding to the light-emitting elements respectively through the connection lines arranged at the same layer and insulated from each other.

It shall be noted that FIG. 6A, FIG. 6B, FIG. 7A, and FIG. 7B illustrate the fold area extending vertically and including the light-emitting elements arranged in the column direction respectively, but the same principle will also apply to the fold area extending horizontally, so a repeated description thereof will be omitted here.

In one implementation, referring to FIG. 6B and FIG. 7B, the connection lines 22 are arranged between the passivation layer 217 and the planarization layer 218, and the driver transistors T11 in the first area are electrically connected with the light-emitting elements 20 through the first via-holes running through the passivation layer 217, the connection lines 22, and the second via-holes running through the planarization layer 218. Since the light-emitting elements 20 and the driver transistors T12 in the second area vertically correspond respectively to each other, the driver transistors T12 in the second area are electrically connected with the light-emitting elements 20 through fifth via-holes running through the passivation layer 217 and the planarization layer 218.

Figure 8:
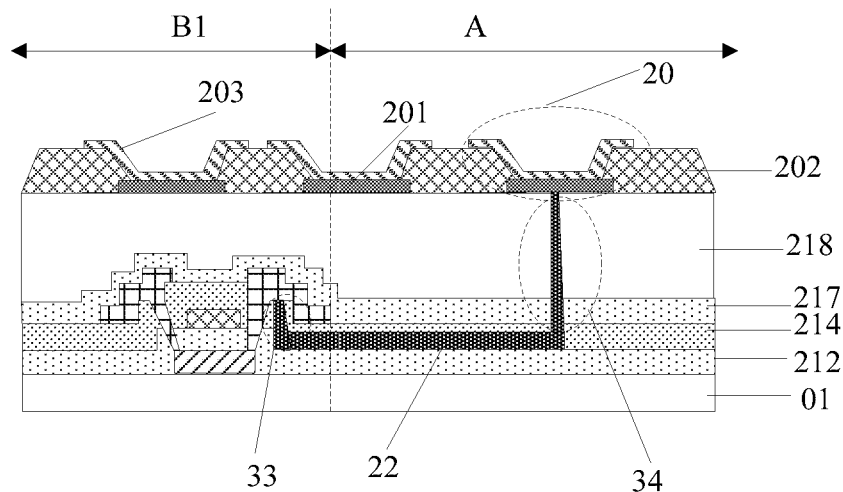
FIG. 8 is a schematic structural diagram of a seventh display panel according to an embodiment of the invention.

In one implementation, referring to FIG. 8, the connection lines 22 are arranged at the same layer as the gates 213, that is, between the interlayer insulation layer 214 and the gate insulation layer 212, and the connection lines 22 are insulated from the gates 213, where the connection lines 22 are electrically connected with the drains 216 through third via-holes 33 running through the interlayer insulation layer 214, and the connection lines 22 are electrically connected with the light-emitting elements 20 through fourth via-holes 34 running through the planarization layer 218, the passivation layer 217, and the interlayer insulation layer 214. Thus the connection lines 22 can alternatively be arranged between the interlayer insulation layer 214 and the gate insulation layer 212 so that the driver transistor T1 in the first area are electrically connected with the light-emitting elements 20 through the third via-holes 33 running through the interlayer insulation layer 214, the connection lines 22, and the fourth via-holes 34 running through the planarization layer 218, the passivation layer 217, and the interlayer insulation layer 214.

It shall be noted that the connection lines according to the embodiment of the invention can alternatively be arranged at another layer, and electrically connected with the light-emitting element through via-holes, although the embodiment of the invention will not be limited thereto. The connection lines in the embodiment of the invention can be made of the material of the sources or the drains, and the gates in the display panel, or made of molybdenum, titanium, or aluminum, although the embodiment of the invention will not be limited thereto. The embodiment of the invention will not be limited to any particular width of the connection lines.

Particularly referring to FIG. 6B, FIG. 7B, or FIG. 8, the light-emitting element 20 in the embodiment of the invention includes a first electrode layer 201, a pixel definition layer 202, and a second electrode layer 203, which are arranged on the planarization layer 218, and a light-emitting layer (not illustrated) arranged between the first electrode layer and the second electrode layer, where the first electrode layer 201 in the first area B1 is electrically connected with the drain 216 through the connection line 22 and the first via-hole, or electrically connected with the drain 216 through the connection line 22, the third via-hole 33, and the fourth via-hole 34. The light-emitting layer can be made of an organic material with a low-molecular weight, or a macro-molecular material, and the light-emitting layer includes an organic emitting layer, and can further include at least one of a Hole Injection Layer (HIL), a Hole Transport Layer (HTL), an Electron Transport Layer (ETL), and an Electron Injection Layer (EIL). The first electrode layer and the second electrode layer can be transparent electrodes or reflecting electrodes. When the first electrode layer is a transparent electrode, then it may include indium tin oxide (ITO), indium zinc oxide (IZO), zinc oxide (ZnO), or indium oxide (In2O3), etc.; when the first electrode layer is a reflecting electrode, then the reflecting layer may be made of Ag, Mg, Al, Pt, Pd, Au, Ni, Nd, Ir, Cr, or a mixture thereof; when the second electrode layer is a transparent electrode, then it may include lithium (Li), calcium (Ca), lithium/calcium fluoride (LiF/Ca), lithium/aluminum fluoride (LiF/Al), aluminum (AL), magnesium (Mg), silver (Ag), or a compound thereof, for example, and can be initially deposited on the light-emitting layer through vaporization, and the material of which the transparent electrode is made, e.g., ITO, IZO, ZnO, In2O3, etc., can be deposited on the compound; and when the second electrode is a reflecting electrode, then the second electrode layer may be formed by vaporizing Li, Ca, LiF/Ca, LiF/Al, Al, Mg, Ag, or a mixture thereof throughout the surface of the substrate.

In a possible implementation, the shape of the connection lines according to the embodiment of the invention can be a zigzag or a grid. Since the connection lines need to be arranged in the fold area, in order to avoid the connection lines from being broken while the connection lines are being bent in the fold area, the shape of the connection lines can be a zigzag or a grid, or the width of the connection lines can be increased. Furthermore when there are a larger number of light-emitting elements in the fold area, then in order to avoid the connection lines arranged at the same layer from interfering with each other, the shapes of the connection lines connecting the light-emitting elements with the driver transistors may be different from each other.

Figure 9:
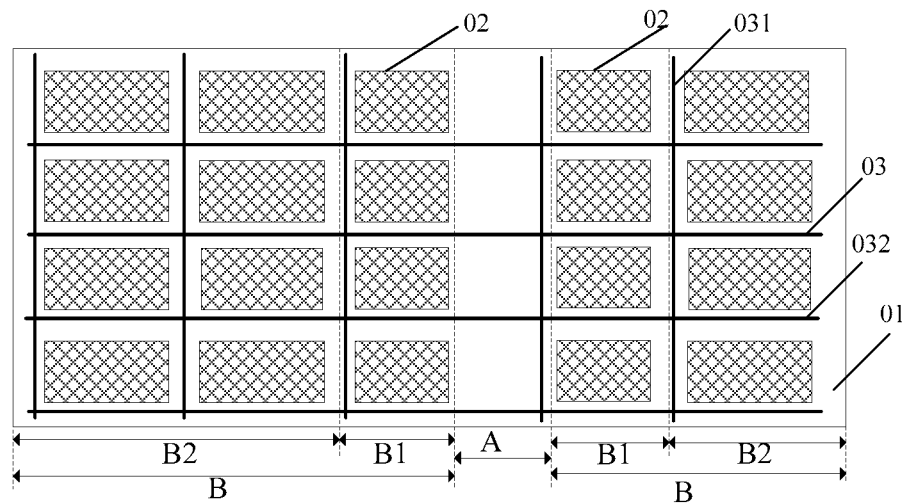
FIG. 9 is a schematic structural diagram of an eighth display panel according to an embodiment of the invention.

In one implementation, the display panel according to the embodiment of the invention further includes: a plurality of signal lines electrically connected with the pixel circuit units, and the signal lines include a plurality of first signal lines extending in a first direction, and a plurality of second signal lines extending in a second direction perpendicular to the first direction, where the at least one fold area extends in the same direction as the direction in which the first signal lines extend. Particularly referring to FIG. 9, the display panel includes a fold area A and a non-fold area B, and the display panel includes: an underlying substrate 01, a plurality of light-emitting elements (not illustrated in FIG. 9), a plurality of pixel circuit units 02 arranged on the underlying substrate 01 in the non-fold area B including at least one first area B1 and at least one second area B2, and a plurality of signal lines 03 electrically connected with the pixel circuit units 02, the signal lines including a plurality of first signal lines 031 extending in a first direction, and a plurality of second signal lines 032 extending in a second direction perpendicular to the first direction, where the at least one fold area A extends in the same direction as the direction in which the first signal lines 031 extend.

In one embodiment, in the display panel according to the embodiment of the invention, the first signal lines 031 are scan lines, and the second signal lines 032 are data lines; or the first signal lines 031 are data lines, and the second signal lines 032 are scan lines.

The extension direction of the fold area A may be the same as the extension direction of the data lines, or the extension of the fold area A may be the same as the extension direction of the scan lines. Here FIG. 9 only illustrates that the extension direction of the fold area A is the same as the extension direction of the first scan lines, but the embodiment of the invention will not be limited to the structure illustrated in FIG. 9.

Particularly the pixel circuit unit includes a driver transistor T1 and a switch transistor T2, and in the circuit structure as illustrated in FIG. 4, the switch transistor T2 has a gate electrically connected with a scan line, and a source or a drain electrically connected with a data line, so that the gate of the switch transistor T2 is turned on by a scan signal on the scan line so that the switch transistor provides a display signal on the data line to a light-emitting element in the display panel.

The structure of the display panel according to the embodiment of the invention will be described below in details by way of an example in which the first signal lines are data lines, that is, the extension direction of the fold area is the same as the extension direction of the data lines.

Figure 10:
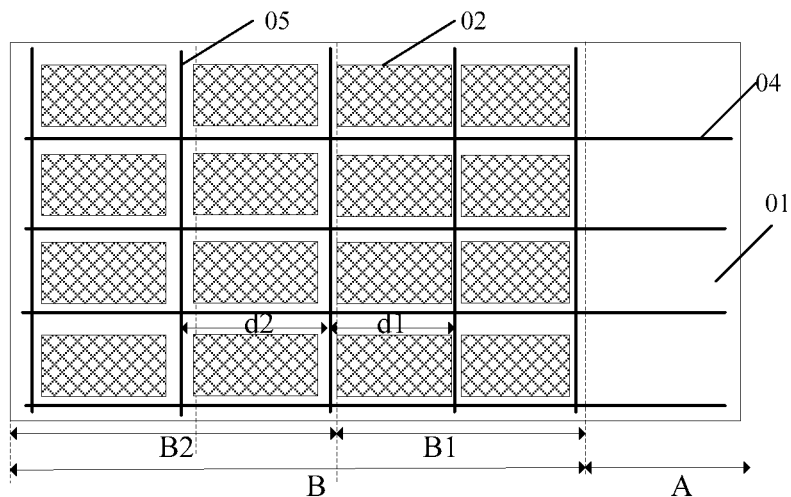
FIG. 10 is a schematic structural diagram of a ninth display panel according to an embodiment of the invention.

In one implementation, in the display panel according to the embodiment of the invention, in order to make the distribution density of the pixel circuit units in the first area higher than the distribution density of the pixel circuit units in the second area, the distance between the data lines in the first area, which are electrically connected with the pixel circuit units can be varied so that the distance between the adjacent pixel circuit units is reduced, and the density of the pixel circuit units in the first area becomes higher. Referring to FIG. 10, the display panel includes a fold area A and a non-fold area B including a first area B1 and a second area B2, where there are pixel circuit units 02, and scan lines 04 and data lines 05 electrically connected with the pixel circuit units 02, in the first area B1 and the second area B2 respectively, and switch transistors in the pixel circuit units 02 include gates electrically connected with scan lines, and sources electrically connected with data lines; and the distance d1 between two adjacent data lines 05 in the first area B1 is shorter than the distance d2 between two adjacent data lines 05 in the second area. B2.

FIG. 10 only illustrates the data lines 05 arranged in the non-fold area, but the data lines 05 can alternatively be arranged in the fold area, and it shall be noted that the pixel circuit units electrically connected with the data lines in the fold area need to be arranged in the first area.

Figure 11:
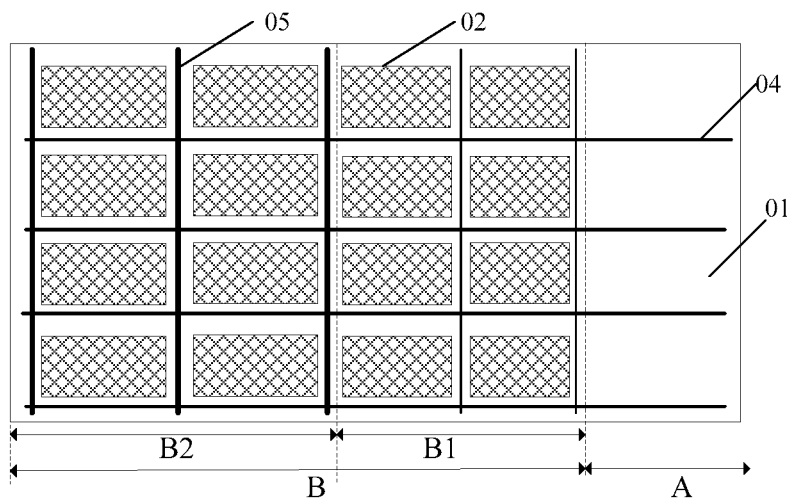
FIG. 11 is a schematic structural diagram of a tenth display panel according to an embodiment of the invention.

In an optional implementation, in the display panel according to the embodiment of the invention, in order to make the distribution density of the pixel circuit units in the first area higher than the distribution density of the pixel circuit unit in the second area, furthermore the line width of the data lines in the first area, i.e., the wiring width of the data lines, can be further varied. Particularly referring to FIG. 11, the display panel includes a fold area A and a non-fold area B including a first area B1 and a second area B2, where there are pixel circuit units 02, and scan lines 04 and data lines 05 electrically connected with the pixel circuit units 02, in the first area B1 and the second area B2 respectively; driver transistors in the pixel circuit units 02 include gates electrically connected with the scan lines 04, and sources electrically connected with the data lines 05; and the line width of the data lines 05 in the first area B1 is smaller than the line width of the data lines 05 in the second area B2. It shall be noted that the line width in the embodiment of the invention refers to the width of a wired line for a signal.

Figure 12:
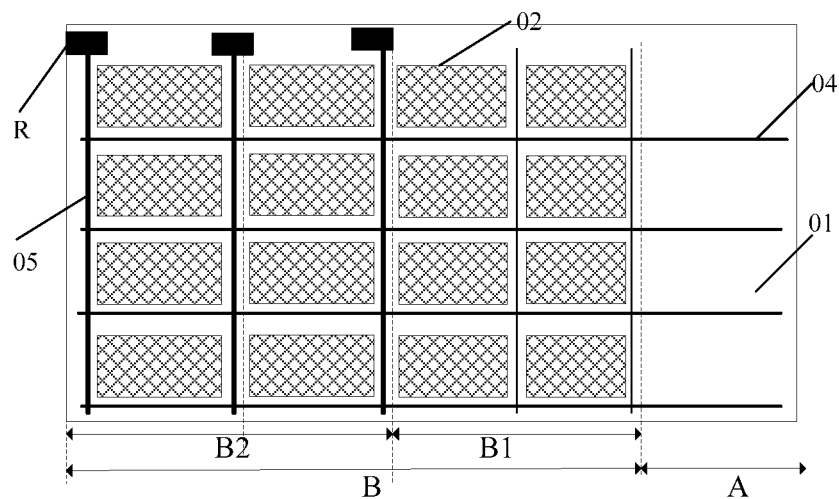
FIG. 12 is a schematic structural diagram of a eleventh display panel according to an embodiment of the invention.

In one embodiment, in order to avoid the resistance of the data lines in the first area from differing from the resistance of the data lines in the second area after the line width of the data lines 5 in the first area is varied, so that there is a different load on the data lines in the first area from a load on the data lines in the second area, in the embodiment of the invention, referring to FIG. 12, the second area B2 further includes: a resistance element R connected in series with the data line 05 in the second area B2, where each data line 05 in the second area B2 can be connected in series with a plurality of resistors with a low resistance so that there is the same load on the data line in the second area as a load on the data line in the first area; or each data line 05 in the second area B2 is connected in series with a resistor with a high resistance so that there is the same load on the data line in the second area as a load on the data line in the first area. Here the resistances and positions of the resistor elements connected in series can be preset as needed in practice although the embodiment of the invention will not be limited thereto.

It shall be noted that in the display panel according to the embodiment of the invention, the line width of the data lines in the first area can be reduced while the distance between two adjacent data lines in the first area is reduced, to thereby increase the distribution density of the pixel circuit units in the first area.

Figure 13:
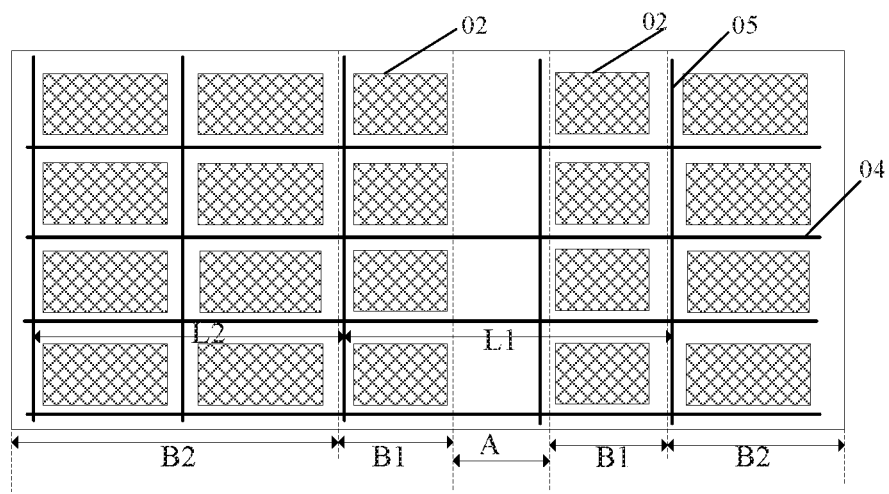
FIG. 13 is a schematic structural diagram of a twelfth display panel according to an embodiment of the invention.

In a particular embodiment of the invention, in the display panel according to the embodiment of the invention, the distance between two adjacent data lines in the first area can be shortened, and/or the line width of the data lines in the first area can be reduced, so that the distribution density of the pixel circuit units in the first area is increased. In one implementation, an improvement is made under the principle that "the sum of the length of the fold area and the lengths of the respective pixel circuit units in the first areas on two sides of the fold area, in the direction of the scan lines is equal to the sum of the lengths of the same number of pixel circuit units in the second area in the direction of the scan lines". For example, referring to FIG. 13, the length L1, of the fold area A and the pixel circuit units 02 in the first areas B1 on two sides of the fold area A, in the direction of the scan lines 04 is equal to the length L2, of the same number of pixel circuit units 02 in the second area B2, in the direction of the scan lines 04.

For pixel circuit units on each scan line, the length of the pixel circuit units in the first area in the direction of the scan lines, and the length of the fold area in the direction of the scan lines are equal to the length, of the same number of pixel circuit units in the second area, in the direction of the scan lines. For example, when there are two pixel circuit units in the first area, the length of the two pixel circuit units in the direction of the scan lines is L0, and the length of the fold area in the direction of the scan lines is L3, then the length, of the two pixel circuit units in the second area, in the direction of the scan lines will be L2, where L0+L3=L2. For example, the distribution density of the pixel circuit units in the second area may be 300 ppi for a clear display effect, and the size of the pixel circuit units in the second area is 84.7 μm; and the width of the fold area is 0.6 mm, and when 12 pixel circuit units need to be arranged respectively in the first areas on two sides of the fold area to control the light-emitting elements in the fold area and the first areas to emit light normally, then the size of each pixel circuit unit in the first area will be 59.7 μm, and the density of the pixel circuit units in the first area will be 425 ppi, where the size refers to the length in the direction of the scan lines.

It shall be noted that the size of the pixel circuit units in the direction of the data lines may be smaller or unvaried although the embodiment of the invention will not be limited thereto.

Figure 14:
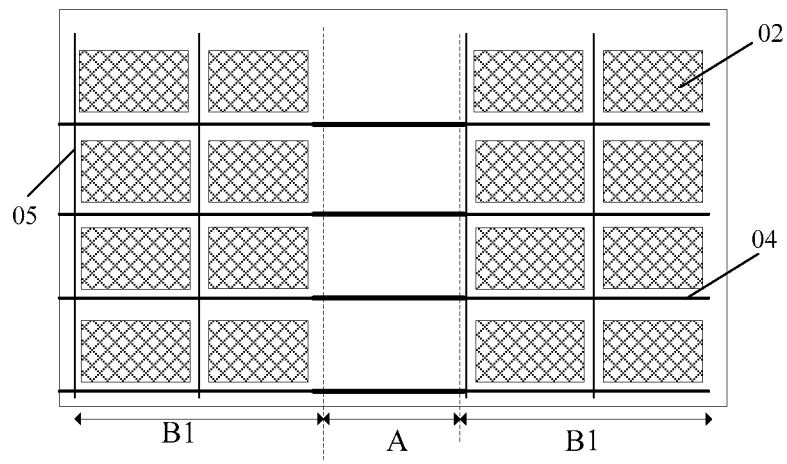
FIG. 14 is a schematic structural diagram of a thirteenth display panel according to an embodiment of the invention.

In one implementation, the extension direction of the fold area is the same as the extension direction of the data lines, and the extension direction of the scan lines is perpendicular to the extension direction of the data lines, so the scan lines will be bent while the fold area is being bent; and in order to improve the robustness against bending of the scan lines while being bent, in the display panel according to the embodiment of the invention, referring to FIG. 14, the line width of the scan lines 04 in the fold area A is more than the line width thereof in the non-fold area B. It shall be noted that the line width here refers to the width of a wired line for a signal.

When there are data lines in the fold area, then in order to avoid the data lines from being broken while being bent, the line width of the data lines in the fold area can also be increased as appropriate although the embodiment of the invention will not be limited thereto. The embodiment of the invention will not be limited to any particular value of the line width of the scan lines in the fold area.

In one implementation, the extension direction of the fold area is the same as the extension direction of the data lines, and the extension direction of the scan lines is perpendicular to the extension direction of the data lines, so the scan lines will be bent while the fold area is being bent; and in order to improve the robustness against bending of the scan lines while being bent, in the display panel according to the embodiment of the invention, the shape of the scan lines in the fold area is a zigzag, or a grid. For example, referring to FIG. 15, the shape of the scan lines 04 in the fold area A is a grid, and furthermore the line width of the scan lines 04 in the fold area A is more than the line width thereof in the non-fold area B. Alternatively only the shape of the scan lines in the fold area is varied, or only the line width of the scan lines in the fold area is varied.

Figure 15:
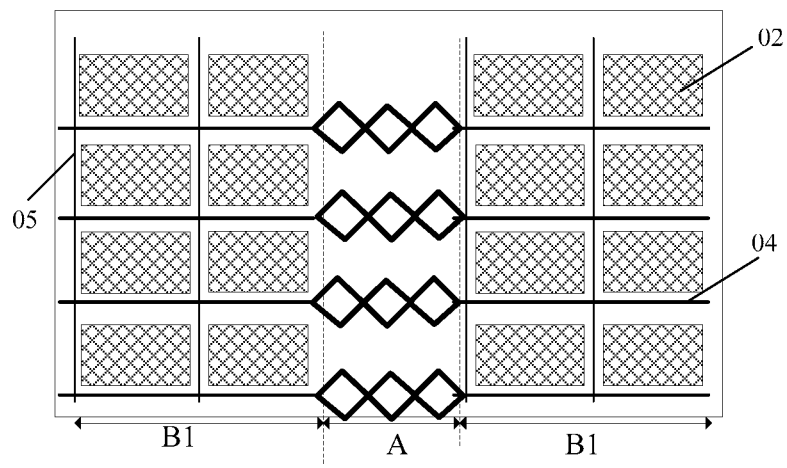
FIG. 15 is a schematic structural diagram of a fourteenth display panel according to an embodiment of the invention.

In one implementation, in order to improve the robustness against bending of the scan lines in the fold area, the length of the scan lines in the fold area can be increased, where the length of the scan lines in the fold area can be increased by varying the shape of the scan lines as illustrated in FIG. 14 and FIG. 15, or otherwise. Particularly the display panel further includes: a plurality of secondary electrically-conductive wires at least arranged in the fold area, the plurality of secondary electrically-conductive wires being arranged at the same layer as the first signal lines and insulated from the first signal lines, where each of the second signal lines is electrically connected with at least one secondary electrically-conductive wires through at least two via-holes in the fold area.

Figure 16:
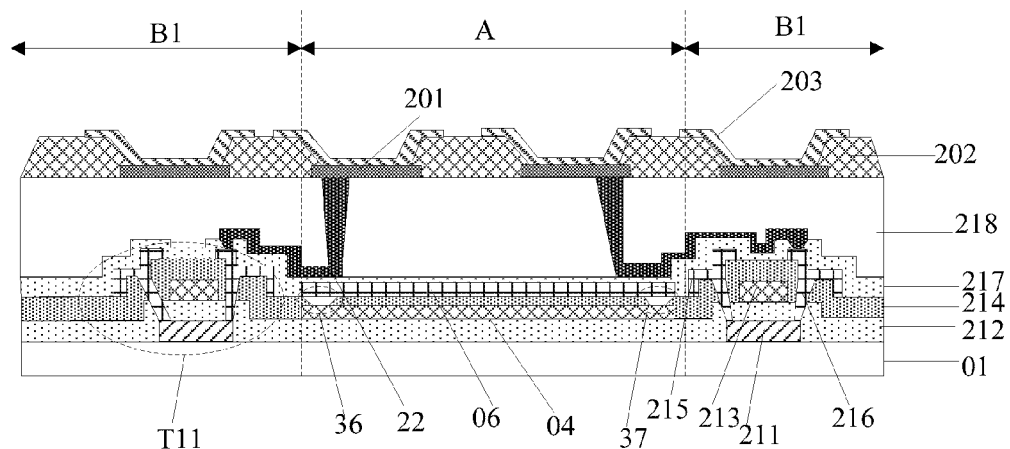
FIG. 16 is a schematic structural diagram of a fifteenth display panel according to an embodiment of the invention.

For example, referring to FIG. 16, the display panel according to the embodiment of the invention includes: an active semiconductor layer 211 on the underlying substrate 01, where the active semiconductor layer includes source areas and drain areas formed by doping with N-type purity ions or P-type purity ions, and channel areas between the source areas and the drain areas in which no purities are doped with; a gate insulation layer 212, gates 213, and an interlayer insulation layer 214 formed on the active semiconductor layer 211, and patterns of sources 215 and drains 216, which are formed on the interlayer insulation layer 214, where the sources 215 and the drains 216 are electrically connected with the source areas and the drain areas in the active semiconductor layer respectively through contact holes in the gate insulation layer 212 and the interlayer insulation layer 214. The display panel further includes a passivation layer 217 and a planarization layer 218 arranged on the layers where the sources 215 and the drains 216 are located. The display panel further includes connection lines 22 electrically connected with the driver transistors T11 in the first area, where the respective drive transistors T1 in the first area B1 are electrically connected with the light-emitting elements 20 corresponding to the driver transistors through the connection lines 22, and the respective connection lines 22 are arranged at the same layer, and insulated from each other; and there are scan lines 04 in the fold area of the display panel, which are arranged at the same layer as the gates 213. The display panel further includes: a plurality of secondary electrically-conductive wires 06 at least arranged in the fold area A, and the plurality of secondary electrically-conductive wires 06 being arranged at the same layer as the data lines and insulated from the data lines, where the each scan line 04 is electrically connected respectively with at least one secondary electrically-conductive wire 06 through at least two via-holes via-hole 36 and a via-hole 37) in the fold area. In the embodiment of the invention, each driver transistor in the first area is electrically connected with the light-emitting element corresponding to the driver transistor through the connection line arranged at the same layer, so that the driver transistors can be arranged in the first area simply by adding one film layer, thus making the fabrication process thereof simple, and the structure of the elements less weighted and simpler.

Particularly in the embodiment of the invention, the extension direction of the fold area is the same as the extension direction of the data lines, a plurality of secondary electrically-conductive wires arranged at the same layer as the data lines can be arranged in the fold area, and the scan lines are electrically connected with the scan lines through at least two via-holes arranged between the secondary electrically-conductive wires and the scan lines; and the extension of the fold area is the same as the extension direction of the scan lines, a plurality of secondary electrically-conductive wires arranged at the same layer as the scan lines can be arranged in the fold area, and the data lines are electrically connected with the data lines through at least two via-holes arranged between the secondary electrically-conductive wires and the data lines.

The structure of the display panel according to the embodiment of the invention will be described below in details by way of an example in which the first signal lines are scan lines, that is, the extension direction of the fold area is the same as the extension direction of the scan lines.

Figure 17:
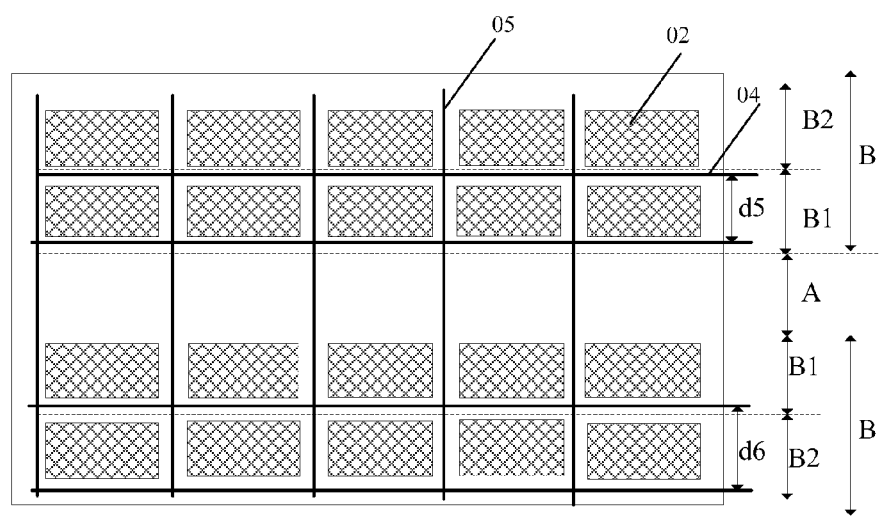
FIG. 17 is a schematic structural diagram of a sixteenth display panel according to an embodiment of the invention.

In one implementation, in the display panel according to the embodiment of the invention, in order to make the distribution density of the pixel circuit units in the first area higher than the distribution density of the pixel circuit units in the second area, the distance between the data lines in the first area, which are electrically connected with the pixel circuit unit can be varied so that the distance between the adjacent pixel circuit units is reduced, and the density of the pixel circuit units in the first area becomes higher. Referring to FIG. 17, the display panel includes a fold area. A and a non-fold area. B including a first area B1 and a second area B2, where there are pixel circuit units 02, and scan lines 04 and data lines 05, electrically connected with the pixel circuit units 02, in the first area B1 and the second area B2 respectively, and switch transistors in the pixel circuit units 02 include gates electrically connected with scan lines 04, and sources electrically connected with data lines 05; and the distance d5 between two adjacent scan lines 04 in the first area B1 is shorter than the distance d6 between two adjacent scan lines 04 in the second area B2.

FIG. 17 illustrates a distribution condition of only a part of the scan lines 04 in the fold area and the non-fold area in the display panel, but there may be a plurality of fold areas and a plurality of non-fold areas throughout the display panel, and FIG. 17 only illustrates the scan lines 04 arranged in the non-fold area B, where the scan lines 04 can be further arranged in the fold area A, but the light-emitting elements electrically connected with the scan lines need to be arranged in the first area B1.

Figure 18:
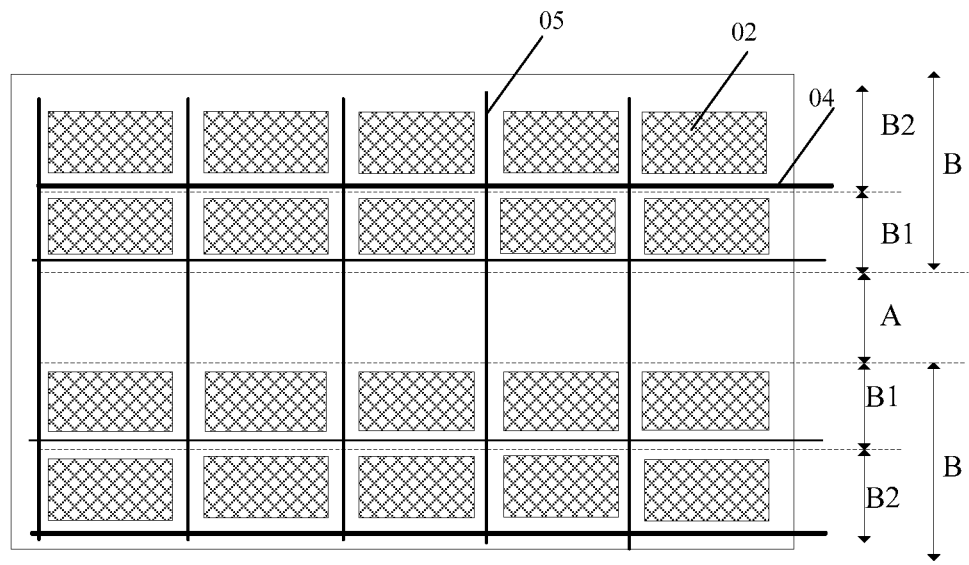
FIG. 18 is a schematic structural diagram of a seventeenth display panel according to an embodiment of the invention.

In one implementation, in the display panel according to the embodiment of the invention, in order to make the distribution density of the pixel circuit units in the first area higher than the distribution density of the pixel circuit unit in the second area, furthermore the line width of the scan lines 04 in the first area, i.e., the wiring width of the scan lines 04, can be further varied. Particularly referring to FIG. 18, the display panel includes a fold area A and a non-fold area B including a first area B1 and a second area B2, where there are pixel circuit units 02, and scan lines 04 and data lines 05 electrically connected with the pixel circuit units 02, in the first area B1 and the second area B2 respectively; switch transistors in the pixel circuit units 02 include gates electrically connected with the scan lines 04, and sources electrically connected with the data lines 05; and the line width of the scan lines 04 in the first area B1 is smaller than the line width of the scan lines 04 in the second area B2. It shall be noted that the line width in the embodiment of the invention refers to the width of a wired line for a signal.

Figure 19:
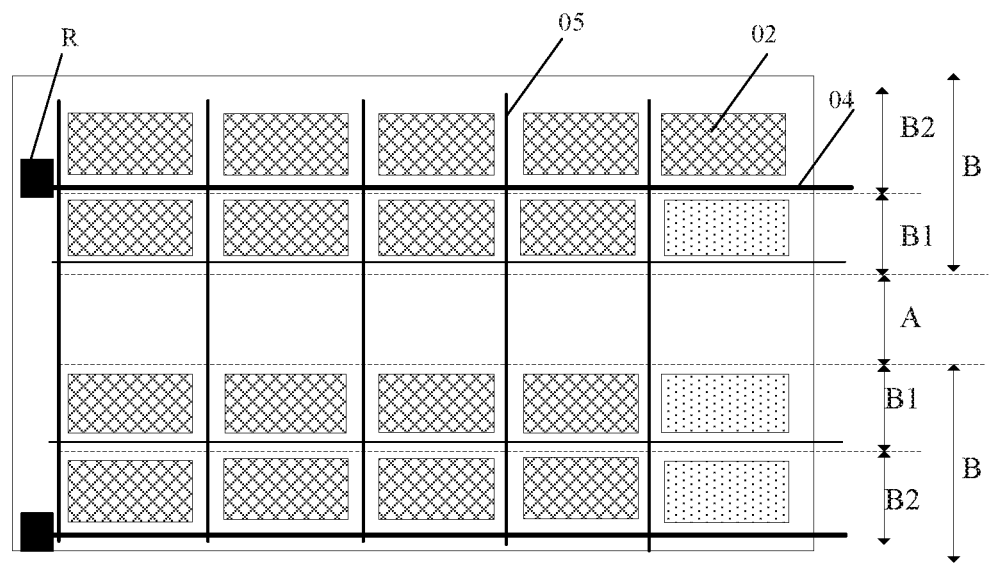
FIG. 19 is a schematic structural diagram of an eighteenth display panel according to an embodiment of the invention.

In one embodiment, in order to avoid the resistance of the scan lines 04 in the first area from differing from the resistance of the scan lines 04 in the second area after the line width of the scan lines 04 in the first area is varied, so that there is a different load on the scan lines 04 in the first area from a load on the scan lines 04 in the second area, in the embodiment of the invention, referring to FIG. 19, the second area B2 further includes: resistance elements R connected in series with the scan lines 04 in the second area B2, where each scan line 04 in the second area B2 can be connected in series with a plurality of resistors with a low resistance so that there is the same load on the scan lines 04 in the second area as a load on the scan lines 04 in the first area; or each scan line 04 in the second area B2 is connected in series with a resistor with a high resistance so that there is the same load on the scan lines 04 in the second area as a load on the scan lines 04 in the first area. Here the resistances and positions of the resistor elements connected in series can be preset as needed in practice although the embodiment of the invention will not be limited thereto.

It shall be noted that in the display panel according to the embodiment of the invention, the line width of the scan lines in the first area can be reduced while the distance between two adjacent scan lines in the first area is reduced, to thereby increase the distribution density of the pixel circuit units in the first area.

Figure 20:
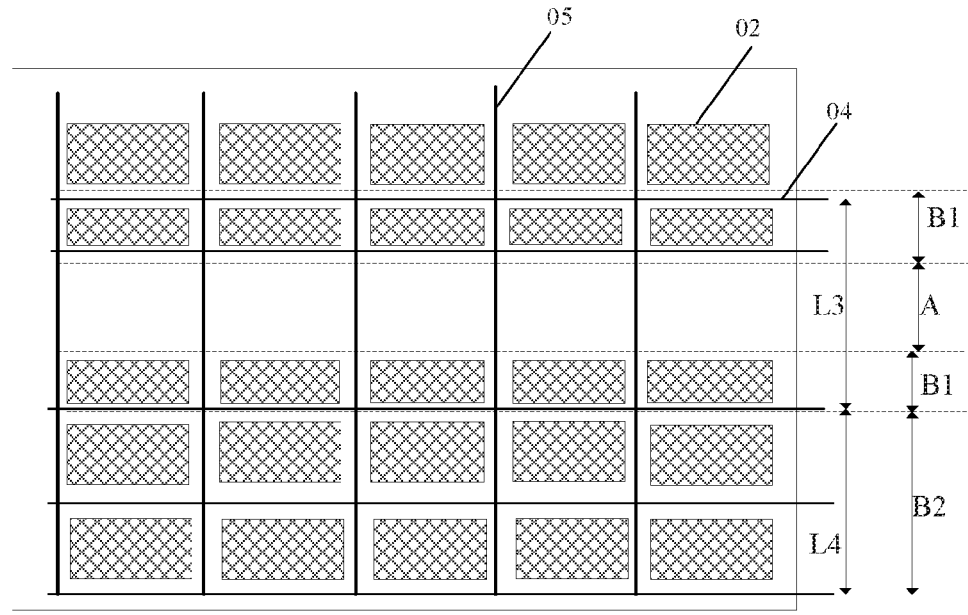
FIG. 20 is a schematic structural diagram of a nineteenth display panel according to an embodiment of the invention.

In one embodiment of the invention, in the display panel according to the embodiment of the invention, the distance between two adjacent data lines in the first area can be shortened, and/or the line width of the data lines in the first area can be reduced, so that the distribution density of the pixel circuit units in the first area is increased. In one implementation, an improvement is made under the principle that "the sum of the length of the fold area and lengths of the respective pixel circuit units in the first areas on two sides of the fold area, in the direction of the data lines is equal to the sum of the lengths of the same number of pixel circuit units in the second area in the direction of the data lines". For example, referring to FIG. 20, the length L3, of the fold area and the respective pixel circuit units 02 in the first areas B1 on two sides of the fold area A, in the direction of the data lines 05 is equal to the length L4, of the same number of pixel circuit units 02 in the second area B2, in the direction of the data lines 05.

Figure 21:
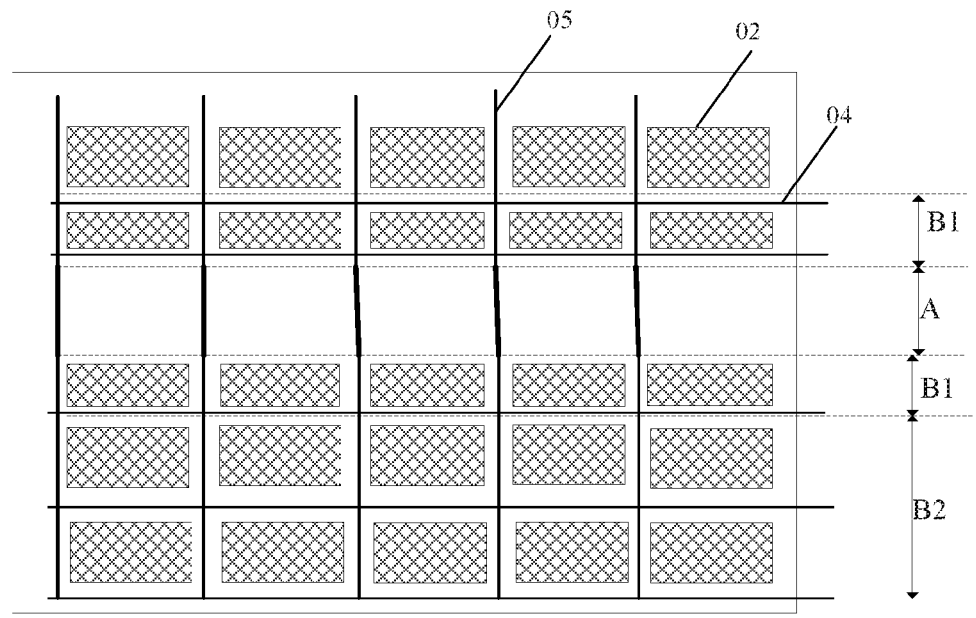
FIG. 21 is a schematic structural diagram of a twentieth display panel according to an embodiment of the invention.

In one implementation, the extension direction of the fold area is the same as the extension direction of the scan lines, and the extension direction of the scan lines is perpendicular to the extension direction of the data lines, so the data lines will be bent while the fold area is being bent; and in order to improve the robustness against bending of the data lines while being bent, in the display panel according to the embodiment of the invention, referring to FIG. 21, the line width of the data lines 05 in the fold area A is larger than the line width thereof in the non-fold area B.

When there are scan lines in the fold area, then in order to avoid the scan lines from being broken while being bent, the line width of the scan lines in the fold area can also be increased as appropriate although the embodiment of the invention will not be limited thereto. The embodiment of the invention will not be limited to any particular value of the line width of the scan lines in the fold area.

In one implementation, the extension direction of the fold area is the same as the extension direction of the scan lines, and the extension direction of the scan lines is perpendicular to the extension direction of the data lines, so the data lines will be bent while the fold area is being bent; and in order to improve the robustness against bending of the scan lines while being bent, in the display panel according to the embodiment of the invention, the shape of the data lines in the fold area is a zigzag, or a grid. For example, referring to FIG. 22, the shape of the data lines 05 in the fold area A is a grid; and furthermore the line width of the data lines 05 in the fold area A is more than the line width thereof in the non-fold area B. Alternatively only the shape of the data lines in the fold area is varied, or only the line width of the data lines in the fold area is varied.

Figure 22:
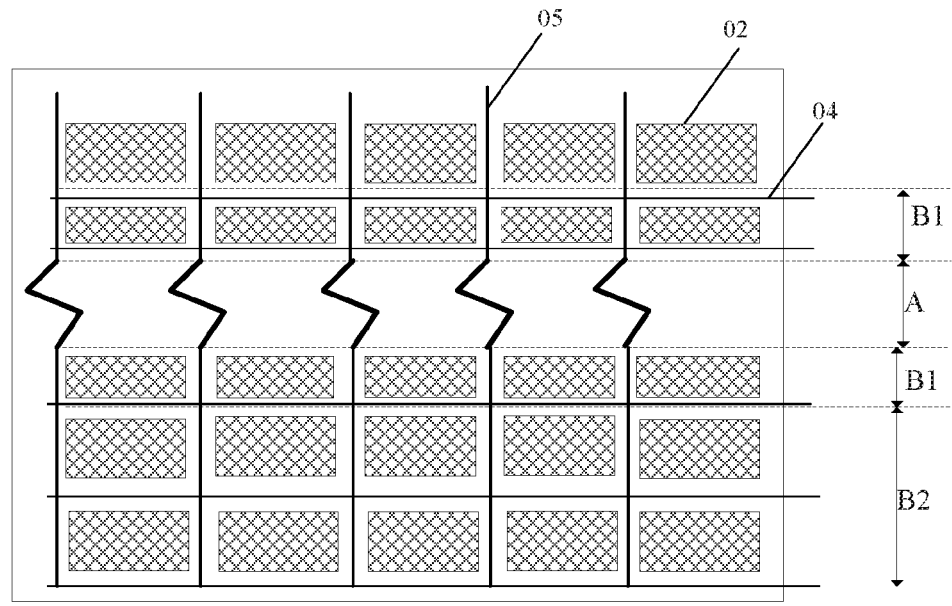
FIG. 22 is a schematic structural diagram of a twenty-first display panel according to an embodiment of the invention.
Figure 23:
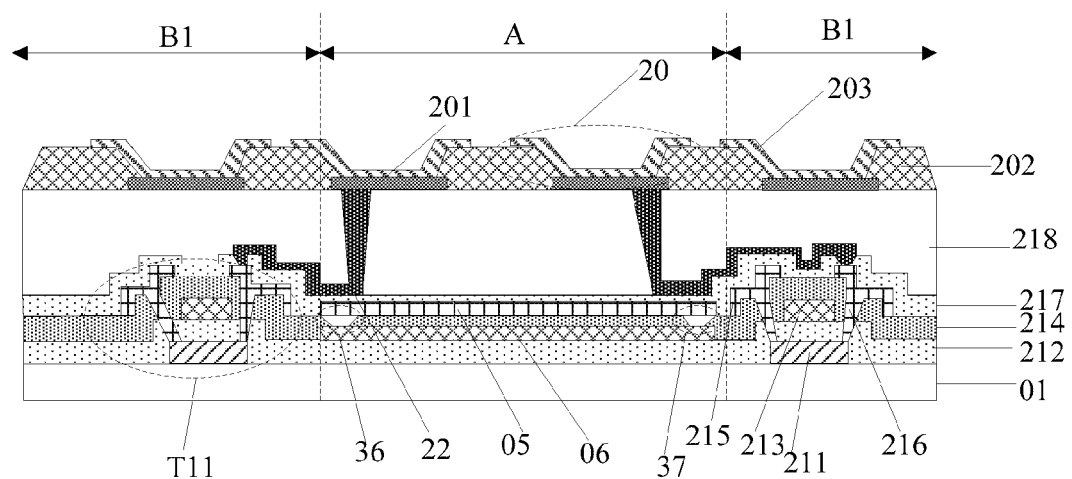
FIG. 23 is a schematic structural diagram of a twenty-second display panel according to an embodiment of the invention.

In one implementation, in order to improve the robustness against bending of the data lines in the fold area, the length of the data lines in the fold area can be increased, where the length of the data lines in the fold area can be increased by varying the shape of the data lines as illustrated in FIG. 22, or otherwise. For example, referring to FIG. 23, the display panel according to the embodiment of the invention includes: an active semiconductor layer 211 on the underlying substrate 01, where the active semiconductor layer includes source areas and drain areas formed by doping with N-type purity ions or P-type purity ions, and channel areas between the source areas and the drain areas in which no purities are doped with; a gate insulation layer 212, gates 213, and an interlayer insulation layer 214 formed on the active semiconductor layer 211, and patterns of sources 215 and drains 216, which are formed on the interlayer insulation layer 214, where the sources 215 and the drains 216 are electrically connected with the source areas and the drain areas in the active semiconductor layer respectively through contact holes in the gate insulation layer 212 and the interlayer insulation layer 214. The display panel further includes a passivation layer 217 and a planarization layer 218 arranged on the layers where the sources 215 and the drains 216 are located. The display panel further includes connection lines 22 electrically connected with the driver transistors T11 in the first area, where the respective drive transistors T1 in the first area B1 are electrically connected with the light-emitting elements 20 corresponding to the driver transistors through the connection lines 22, and the respective connection lines 22 are arranged at the same layer, and insulated from each other; and there are data lines 05 in the fold area of the display panel, which are arranged at the same layer as the sources 215 and the drains 216. The display panel further includes: a plurality of secondary electrically-conductive wires 06 at least arranged in the fold area A, and the plurality of secondary electrically-conductive wires 06 being arranged at the same layer as the scan lines and insulated from the scan lines, where each of the data lines 05 are electrically connected respectively with at least one secondary electrically-conductive wire 06 through at least two via-holes (a via-hole 36 and a via-hole 37 running through the interlayer insulation layer) in the fold area. It shall be noted that the secondary electrically-conductive wires can alternatively be fabricated from another electrically conductive layer on the display panel although the embodiment of the invention will not be limited thereto.

In one implementation, the display panel according to the embodiment of the invention further includes: scan driver circuits arranged in the edge frame area, and electrically connected with the respective scan lines, where the scan driver circuits are arranged in the non-fold area. Particularly referring to FIG. 24, the display panel includes a fold area A and a non-fold area B, the extension direction of the fold area A is the same as the extension direction of the scan line 04, and the edge frame area D of the display panel includes: scan driver circuits 08 electrically connected with the respective scan lines 04, and arranged in the non-fold area B. For example, the scan driver circuits 08 include the scan driver circuits 08 arranged on upper and lower sides of the fold area A, where the upper scan driver circuit and the lower scan driver circuit are electrically connected, and wires connecting the upper and lower scan driver circuits are arranged in the fold area, but an improvement can be made according to the implementation of the scan lines or the data lines in the fold area in the embodiment of the invention, so a repeated description thereof will be omitted here.

In one embodiment, in the display panel according to the embodiment of the invention, the length of the scan driver circuits in the direction of the second signal lines (the data lines) is equal to the length, of the respective pixel circuit units electrically connected with the first signal lines (the scan lines) connected with the scan driver circuits, in the direction of the second signal lines. For example, referring to FIG. 24, the scan driver circuits 08 each include a plurality of scan driver sub-circuits, each of which is connected respectively with corresponding one of the scan lines. The non-fold area B includes a first area B1 and a second area B2, there are pixel circuit units 021 arranged in the first area B1, and pixel circuit units 022 arranged in the second area B2, and the scan driver sub-circuits include a first scan driver sub-circuit 081 corresponding to the scan line 04 electrically connected with the pixel circuit unit 021 in the first area B and a second scan driver sub-circuit 082 corresponding to the scan line 04 electrically connected with the pixel circuit unit 022 in the second area B2 respectively. The (sum of) the lengths of the first scan driver sub-circuits 081 (is)are substantially equal to the (sum of) the lengths, of the respective pixel circuit units in the first area, in the direction of the data lines, and the (sum of) the lengths of the second scan driver sub-circuits 082 (is)are substantially equal to the (sum of) the lengths, of the respective pixel circuit units in the second area, in the direction of the data lines, as illustrated in FIG. 24.

Figure 24:
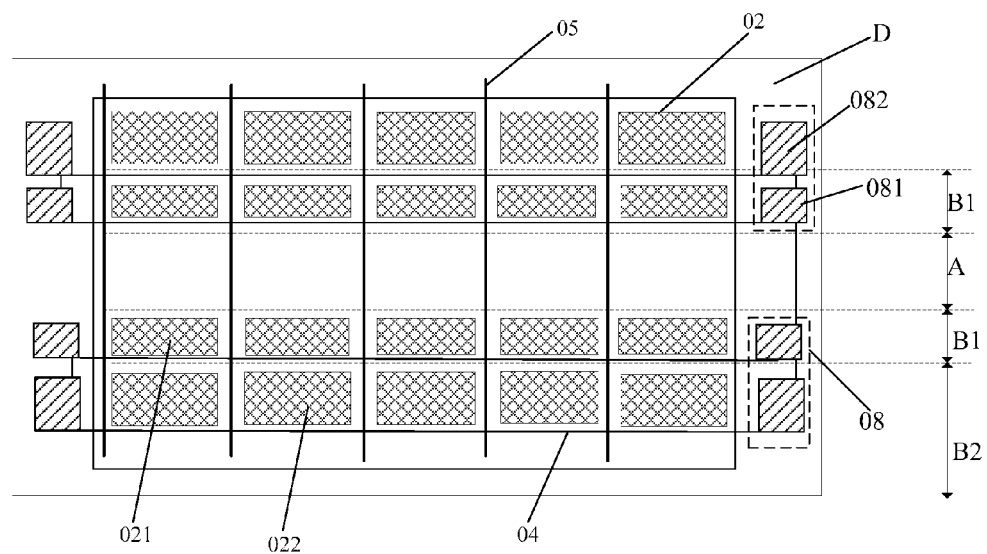
FIG. 24 is a schematic structural diagram of a twenty-third display panel according to an embodiment of the invention.

It shall be noted that in the embodiment of the invention, FIG. 24 illustrates only one row of pixel circuit units arranged respectively in each of the two first areas on two sides of the fold area, but in one implementation, there may be a plurality of rows of pixel circuit units in each first area, and the sum of the lengths of the first scan driver sub-circuits configured to drive the plurality of pixel circuit units is substantially the same as the sum of the lengths of the plurality of lows of pixel circuit units in the direction of the data lines. Furthermore the sum of the lengths of the second scan driver sub-circuits corresponding to the plurality of lows of pixel circuit units in the second area is substantially equal to the sum of the lengths of the plurality of lows of pixel circuit units in the direction of the data lines. FIG. 24 only illustrates the scan driver circuits arranged respectively on the left and right sides of the display area, but the embodiment of the invention will not be limited to the structure of the display panel as illustrated in FIG. 24. Accordingly the scan driver circuits in the display panel according to the embodiment of the invention can be arranged on only the left side of the display area, or arranged on only the right side of the display area, so that the scan lines will be scanned using only the scan driver circuits on that side, although the embodiment of the invention will not be limited thereto. Furthermore alike when the folding direction is the extension direction of the data lines, then data line driver circuits configured to drive the respective data lines can also be arranged in the same pattern as above, so a repeated description of the particular pattern in which they are arranged will be omitted here.

It shall be noted that the display panel according to the embodiment of the invention can be an organic light-emitting diode display panel, an electronic paper, or another type of display panel.

Figure 25:
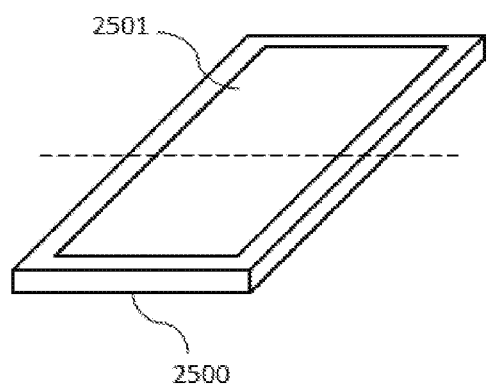
FIG. 25 is a schematic diagram of a display device according to an embodiment of the invention.

Based upon the same inventive idea, as shown in FIG. 25, an embodiment of the invention further provides a display device 2500 including the display panel 2501 according to any one of the embodiments above of the invention. The flexible display device 2500 according to the embodiment of the invention can be, for example, a foldable smart phone, a wearable smart watch, smart glasses, a tablet computer, a TV set, a display, a notebook computer, a digital photo frame, a navigator, an on-vehicle display, an electrophoresis display, an electronic book, or any other product or component including a flexible display screen. Innovative aspects and advantageous effects of the display device according to the embodiment of the invention are the same as the innovative aspects and the advantageous effects of the display panel according to the embodiments of the invention, so a repeated description thereof will be omitted here.

A display panel according to an embodiment of the invention includes a fold area, and at least one non-fold area proximate to the fold area; and the display panel includes: an underlying substrate, a plurality of light-emitting elements, and a plurality of pixel circuit units arranged on the underlying substrate, which are arranged in the non-fold area; where the non-fold area includes at least one first area and second area; and there are a plurality of the pixel circuit units arranged in an array respectively in the first area and the second area, the first area is adjacent to the fold area, the second area is located on the side of the first area away from the fold area, and the distribution density of the pixel circuit units in the first area is higher than or equal to the distribution density of the pixel circuit units in the second area. Accordingly in the display panel according to the embodiment of the invention, the pixel circuit units are arranged in the non-fold area, and there are no pixel circuit units arranged in the fold area, so that the pixel circuit units can be avoided from being damaged while the fold area is being folded or bent; and furthermore the pixel circuit units corresponding to the fold area are arranged in the first area, and the distribution density of the pixel circuit units in the first area is higher than or equal to the distribution density of the pixel circuit units in the second area, so that the light-emitting elements corresponding to the fold area are driven by the pixel circuit units in the first area to thereby display normally so as to improve the robustness against bending of the display panel without degrading the display effect on the display panel.

Evidently those skilled in the art can make various modifications and variations to the invention without departing from the spirit and scope of the invention. Accordingly the invention is also intended to encompass these modifications and variations thereto so long as the modifications and variations come into the scope of the claims appended to the invention and their equivalents.

The invention claimed is:

1. A display panel, comprising:
at least one fold area, and at least one non-fold area proximate to the fold area, the display panel comprising: an underlying substrate, a plurality of light-emitting elements, and a plurality of pixel circuit units arranged on the underlying substrate, the plurality of pixel circuit units being arranged in the non-fold area; wherein:
the at least one non-fold area comprises at least one first area and at least one second area; and
there are a plurality of the pixel circuit units arranged in an array respectively in the first area and the second area, the first area is adjacent to the fold area, the second area is located on a side of the first area away from the fold area, and a distribution density of the pixel circuit units in the first area is higher than or equal to a distribution density of the pixel circuit units in the second area;
wherein the display panel further comprises: a plurality of signal lines electrically connected with the pixel circuit units, and the signal lines comprise a plurality of first signal lines extending in a first direction, and a plurality of second signal lines extending in a second direction perpendicular to the first direction, wherein the at least one fold area extends in the same direction as the direction in which the first signal lines extend; wherein a line width of each of the first signal lines in the first area is less than a line width of each of the first signal lines in the second area.

2. The display panel according to claim 1, wherein:
an occupancy area of each of the pixel circuit units in the first area is less than or equal to an occupancy area of each of the pixel circuit units in the second area.

3. The display panel according to claim 2, wherein each of the pixel circuit units comprises a driver transistor and a switch transistor, the driver transistor is configured to drive one of the light-emitting elements to emit light, light-emission luminance being determined by a voltage at a gate of the driver transistor, and the switch transistor is configured to receive and transmit signal, and to transmit a voltage signal to the gate of the driver transistor before the light-emitting element emits light;
a ratio of the length to width of each of the driver transistors is same, and storage capacitance between a source and drain and the gate of each of the driver transistors is same; and
an occupancy area of each of the driver transistors in the first area is less than or equal to an occupancy area of each of the driver transistors in the second area.

4. The display panel according to claim 1, wherein:
a distance between adjacent two ones of the first signal lines in the first area is shorter than a distance between adjacent two ones of the first signal lines in the second area.

5. The display panel according to claim 1, wherein the second area further comprises resistance elements connected in series with the first signal lines in the second area.

6. The display panel according to claim 1, wherein:
a length, of the fold area and the pixel circuit units in the first areas on two sides of the fold area, in the direction of the second signal lines is equal to a length, of the same number of pixel circuit unit in the second area, in the direction of the second signal lines.

7. The display panel according to claim 1, wherein a line width of each of the second signal lines in the fold area is more than the line width thereof in the non-fold area.

8. The display panel according to claim 1, wherein a shape of each of the second signal lines in the fold area is one or more of: a zigzag and a grid.

9. The display panel according to claim 1, wherein the display panel further comprises:
a plurality of secondary electrically-conductive wires at least arranged in the fold area, and the plurality of secondary electrically-conductive wires are arranged at the same layer as the first signal lines and insulated from the first signal lines, wherein each of the second signal lines are electrically connected with at least one of the secondary electrically-conductive wires through at least two via-holes in the fold area.

10. The display panel according to claim 1, wherein:
the first signal lines are one or more of: data lines, and scan lines.

11. The display panel according to claim 10, wherein the first signal lines are scan lines, and there is an edge frame area in the display panel; and the display panel further comprises: scan driver circuits arranged in the edge frame area, and electrically connected with the first signal lines; and
the scan driver circuits are arranged in the non-fold area.

12. The display panel according to claim 11, wherein:
the length of the scan driver circuits in the direction of the second signal lines is equal to the length, of the pixel circuit units electrically connected with the first signal lines connected with the scan driver circuits, in the direction of the second signal lines.

13. The display panel according to claim 1, wherein there is a display area in the display panel, and the display panel further comprises:

the light-emitting elements in an array and uniformly arranged in the display area;

wherein the pixel circuit units in the second area vertically correspond respectively to the light-emitting elements and are electrically connected with the light-emitting elements, and the pixel circuit units in the first area correspond respectively to and are electrically connected with the light-emitting elements.

14. The display panel according to claim 13, wherein each of the pixel circuit units comprises a driver transistor, and the display panel further comprises: connection lines each connected with each of the driver transistors; and the driver transistors in the first area are electrically connected with the light-emitting elements corresponding to the driver transistors through the connection lines;

wherein the connection lines are arranged at the same layer, and insulated from each other.

15. The display panel according to claim 14, wherein the display panel comprises sources and drains, a passivation layer, the connection lines, and a planarization layer in that order away from the underlying substrate; and the driver transistors in the first area are electrically connected with the light-emitting elements through first via-holes running through the passivation layer, the connection lines, and second via-holes running through the planarization layer.

16. The display panel according to claim 14, wherein the display panel comprises the connection lines, an interlayer insulation layer, sources and drains, a passivation layer, and a planarization layer in that order away from the underlying substrate; and the driver transistors in the first area are electrically connected with the light-emitting elements through third via-holes running through the interlayer insulation layer, the connection lines, and fourth via-holes running through the planarization layer, the passivation layer, and the interlayer insulation layer.

17. The display panel according to claim 14, wherein the shape of each of the connection lines is one or more of: a zigzag and a grid.

18. A display device, comprising:

a display panel, wherein the display panel comprises at least one fold area, and at least one non-fold area proximate to the fold area, and the display panel further comprising:

an underlying substrate, a plurality of light-emitting elements, and a plurality of pixel circuit units arranged on the underlying substrate, the plurality of pixel circuit units being arranged in the non-fold area; wherein:

the at least one non-fold area comprises at least one first area and at least one second area; and there are a plurality of the pixel circuit units arranged in an array respectively in the first area and the second area, the first area is adjacent to the fold area, the second area is located on a side of the first area away from the fold area, and a distribution density of the pixel circuit units in the first area is higher than or equal to a distribution density of the pixel circuit units in the second area; and wherein the display panel further comprises: a plurality of signal lines electrically, connected with the pixel circuit units, and the signal lines comprise a plurality of first signal lines extending, in a first direction, and a plurality of second signal lines extending, in a second direction perpendicular to the first direction, wherein the at least one fold area extends in the same direction as the direction in which the first signal lines extend; wherein a line width of each of the first signal lines in the first area is less than a line width of each of the first signal lines in the second area.

* * * * *